United States Patent [19]

Stoermer et al.

[11] Patent Number: 4,471,259

[45] Date of Patent: Sep. 11, 1984

[54] CRYSTAL PACKAGE FOR A HIGH-G ENVIRONMENT

[75] Inventors: Pierre Stoermer, Baldwin, Md.; Aristotelis S. Arvanitis, Addison, Ill.; Philip P. Macnak, Plantation, Fla.

[73] Assignee: Motorola Inc., Schaumburg, Ill.

[21] Appl. No.: 412,050

[22] Filed: Aug. 26, 1982

[51] Int. Cl.³ .......................................... H01L 41/08
[52] U.S. Cl. .................................. 310/353; 310/348; 357/26
[58] Field of Search .................. 73/35, 717, 721, 723, 73/727, DIG. 4; 310/328, 340, 344, 348, 354, 368, 800, 349, 353; 29/25.35; 357/26

[56] References Cited

U.S. PATENT DOCUMENTS

| | | | |
|---|---|---|---|
| 1,996,569 | 4/1935 | Byrnes et al. | |
| 2,032,865 | 3/1936 | Bielig | |
| 2,413,579 | 12/1946 | Pennybacker | |
| 2,429,826 | 10/1947 | Kuenstler | |
| 2,434,266 | 1/1948 | Fruth et al. | |
| 2,509,478 | 5/1950 | Caroselli | |
| 2,967,957 | 1/1961 | Massa | 310/366 |
| 3,221,189 | 11/1965 | Brandt et al. | |
| 3,336,487 | 8/1967 | Martyn et al. | |
| 3,351,493 | 11/1967 | Weiman et al. | 357/26 |
| 3,453,458 | 7/1969 | Curran et al. | 310/366 |
| 3,723,920 | 3/1973 | Sheahan et al. | |
| 3,828,210 | 8/1974 | Livenick et al. | |
| 3,970,880 | 7/1976 | Deutschmann et al. | |
| 4,058,744 | 11/1977 | Dano et al. | |
| 4,234,811 | 11/1980 | Hishida et al. | 310/348 |
| 4,295,009 | 10/1981 | Weidler | 310/348 |

OTHER PUBLICATIONS

"Ceramic Flat Pack Enclosures for Precision Quartz Crystal Units" by R. Donald Peters, of General Electric Co., p. 224.

"A New Ceramic Flat Pack for Quartz Resonators" by P. D. Wilcox and G. S. Snow, of Sandia Labs., Albuquerque, NM.

"Quartz Crystal Units for High G Environment" by Marvin Bernstein, of Electronic Components Laboratory, U.S. Army Electronics Command.

Buchanan, J., "Handbook of Piezoelectric Crystals," Philco, for Wright Air Development Ctr., Dec. 1954, pp. 53-58.

Primary Examiner—J. D. Miller
Assistant Examiner—D. L. Rebsch
Attorney, Agent, or Firm—F. John Motsinger; Edward M. Roney; James W. Gillman

[57] ABSTRACT

A shock-resistant low profile crystal package and internal crystal mounting apparatus capable of adequately protecting a multi-electrode crystal plate from high-G forces occasionally experienced by the mishandling of the particular article in which the component has been mounted. The crystal plate is positioned within an aperture of the base member and is supported about its edge during wire-bonding of the electrode pattern to the terminal connecting pins of the base member. Since the crystal plate is free-floating about its central position, the crystal can undergo thin film metallization of an electrode pattern from either side of the crystal plate to achieve desired frequency parameters. A ceramic retaining ring is placed on top of the crystal plate and the overall package is hermetically sealed by the welding of a cover to each end thereof. The base member of the crystal package is manufactured from a ceramic material which will enable the assembled crystal package to be mounted to hybrid substrate circuit boards or similar modules.

7 Claims, 5 Drawing Figures

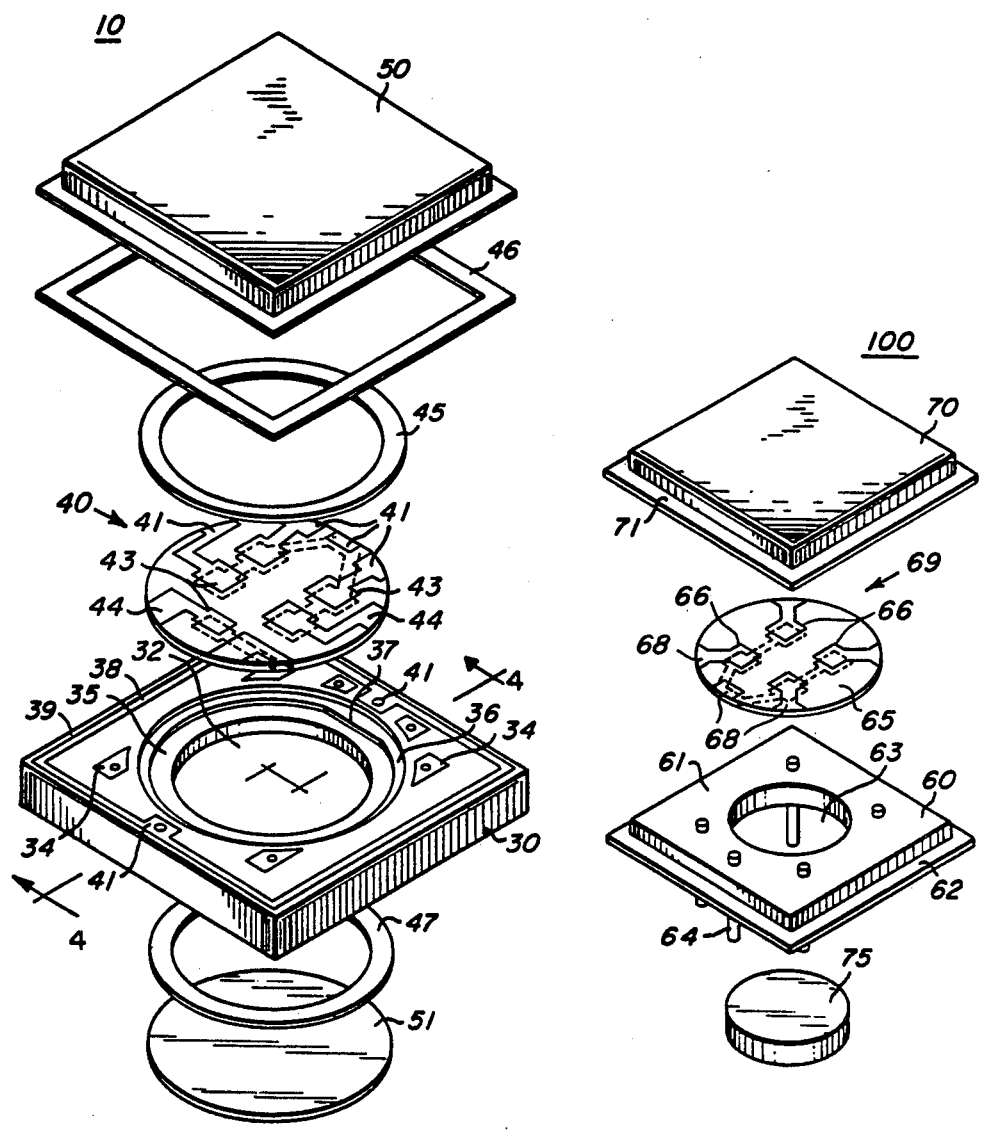

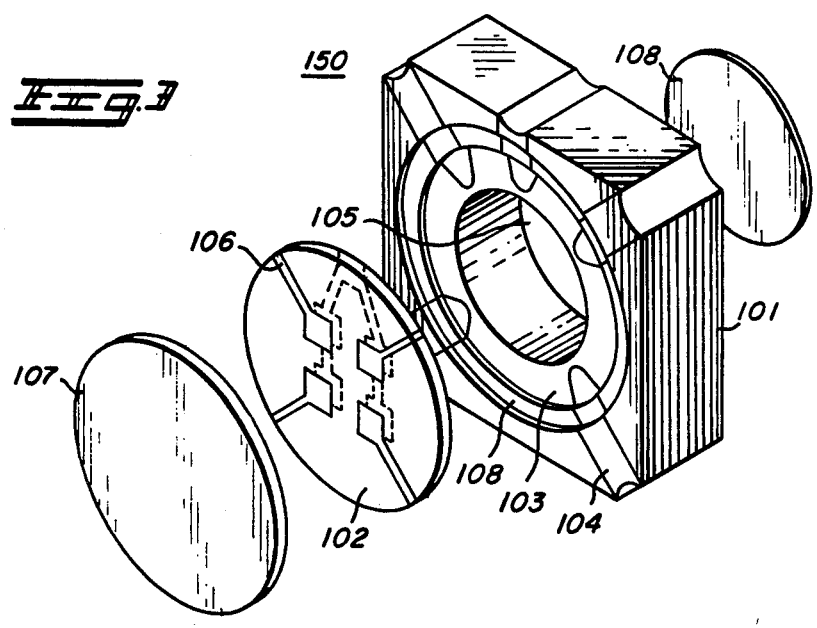
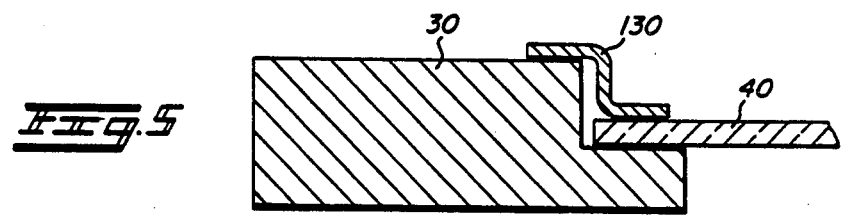
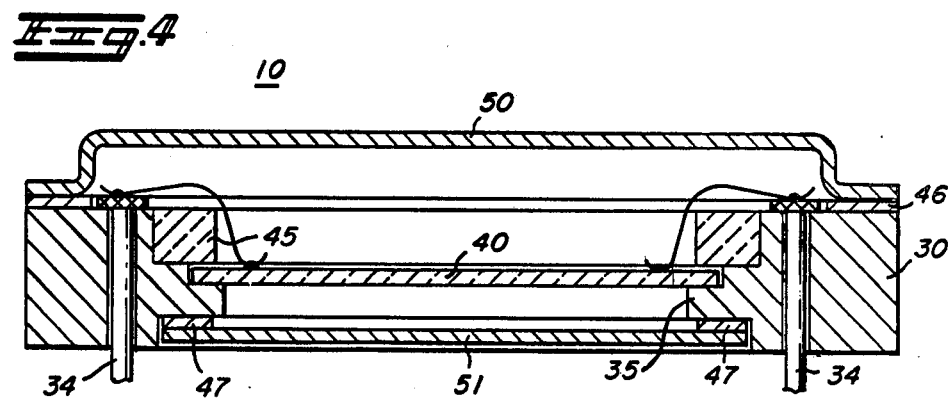

CRYSTAL PACKAGE FOR A HIGH-G ENVIRONMENT

BACKGROUND OF THE INVENTION

The present invention relates in general to mounting arrangements for quartz crystal-packages and more particularly to a low-profile crystal package which may be utilized in high-G environments without damage to the crystal plate inside.

In recent years, space limitations within communications equipment have required smaller and stronger crystal mounting assemblies. This has caused an increase in the electrical and mechanical problems of adequately fixturing and mounting a crystal plate within a crystal package, while not damaging the crystal plate, maintaining frequency standardization of the crystal plate and avoiding internal environmental contamination during the hermetic sealing process. Likewise, as crystal applications have become more and more complex, multiple electrical contact points are required, on smaller and thinner crystal plates being mandated by the higher operating frequencies of the associated electronic equipment. All of these developments have increased the mechanical complexity of the crystal package utilized to protect, house and ease the multiple electrical connections required by multipole crystal filter components.

As the demand for portability of personal communications and electronic equipment continues to increase, the internal electrical components have to be packaged in a manner sufficient to withstand sudden occurrences of high-G forces, in the 2,000–8,000-G range, which occasionally result from the electronic equipment's being accidentally dropped by the user. Various shock-resistant crystal-mounting approaches have been attempted in the past with varying degrees of success.

New bonding methods have been developed as the size of the crystal plate has deceased. The foremost methods in the art are the various ultrasonic scrubbing- wire- bonding approaches used. This process requires that the crystal plate be supported at the contact point during the bonding process when the required pressure is applied to the surface of the plate, as dictated by the bonding process. The crystal plate has to be supported, yet remain undamped and usable thereafter. Therefore most crystal packages have to be made to facilitate automatic wire-bonding between the crystal plate and the crystal package.

Today there are various types of crystal-mounting apparatus which are in common usage. In one approach, the quartz crystal wafer is supported by a center mounting post, which allows the horizontal mounting of the crystal and reduces the overall height of the crystal-package assembly. A disadvantage of this crystal-mounting approach is that the crystal plate needs to be supported adequately during the wire-bonding process so as to withstand the surface pressures involved without sustaining damage. During assembly of the crystal plate onto the respective center-post-mounting position, it is desirable to avoid overstressing the plate, which can result from the means of mounting the crystal plate in the crystal package or from the mechanical stresses which develop during the hermetic sealing of the crystal package. Another disadvantage of this mounting approach is that the crystal plate cannot undergo metallization of the electrode pattern on either side once the plate has been mounted within the crystal package, since the center mounting post requires a plate which has the electrode pattern deposited prior to fixturing and mounting within the crystal package.

The prior-art sealing techniques have generally consisted of the steps of sealing a pair of terminals in an eyelet to form a header, mounting a crystal wafer on an associated header, and hermetically sealing the header to a protective metal or glass container, with the crystal wafer positioned within the container. Headers have been characterized either as matched-glass or compression-glass headers. In both the integrity of the terminal to eyelet seal is dependent upon the attainment of a good seal between the terminal and the glass. Once sealed, the crystal package can be used in many different low-G environments with a high degree of confidence that the internal crystal plate will perform at the desired frequency. A common disadvantage is that a sudden shock or experience of high-G forces will result in the breakage of the internal crystal plate with a corresponding loss of performance.

Another disadvantage of crystal packages is that typically such are assembled from metallic subcomponents, which means that the overall crystal-mounting structure is not compatible with present hybrid microelectronic technologies. Suitable high-G packages of various crystal oscillators for environments involving hybrid mountings do not yet exist.

A disadvantage common to all of the prior-art devices involves the relatively high cost and complexity of most crystal package apparatus.

SUMMARY OF THE INVENTION

It is therefore an object of the present invention to provide a crystal package able to withstand sudden high-G forces without damaging the crystal blank mounted therein.

Another object of the present invention is to provide a shock-resistant crystal package as well as a shock-resistant mounting scheme for facilitating the internal mounting and protection of multielectrode crystal plates.

Still another object of the present invention is to provide an improved means of mounting a crystal plate which will allow automatic wire-bonding of the electrode pattern to the appropriate terminal pins of the crystal package, yet permit the crystal plate to float freely when mounted.

A further object of this invention is to provide a crystal package which will allow the crystal plate to be peripherally damped after mounting, which will reduce the retarding of high-frequency harmonics during operation.

Another object of this invention is to provide an improved method of making a crystal package which is adapted to high-G environments and suitable for use in mounting arrangements involving hybrid-substrate materials.

Yet another object of this invention is to provide a crystal-mounting structure which will adequately position the crystal plate to receive thin-film metal deposition on either side of the crystal plate to achieve the desired frequency.

A still further object of the present invention is to provide a crystal package able to withstand relatively high-G forces and be compatible for mounting the package in a hybrid-substrate module.

A further object of this invention is to provide a sturdy crystal-mounting apparatus which will result in improved change in frequency-vs.-temperature characteristics of the crystal plate during operation.

Yet another object of the present invention is to provide a crystal package for multielectrode crystal plates which is of low cost, of simple design, not pin-out limited and is readily and easily manufactured.

In practicing the invention an improved crystal package capable of withstanding high-G forces is provided for accommodating a keyed crystal plate having a plurality of conductive electrode patterns on a surface so as to provide support to the crystal plate during wire bonding of the electrode pattern to the appropriate terminal connecting pins contained in the base member of the crystal package. The crystal package is placed in a recess area in a shock resistant base member, being supported and positioned around the peripheral edge. The base member has a central aperture therein which allows the crystal plate to float freely within the base member once the crystal plate is positioned therein. The crystal plate is held in place by placing a ceramic retaining ring atop the outer peripheral edge of the crystal plate, within a larger recessed area of the base member. Preformed solder rings are placed above the retaining ring and immediately beneath the central aperture in the base member. A top and bottom cover are then placed over the base member and the overall package is raised to a ambient temperature which is sufficiently high to melt the solder rings which will fuse the top and bottom covers to the base member, thereby perfecting a hermetic seal of the crystal package.

BRIEF DESCRIPTION OF THE DRAWINGS

The features of the present invention which are believed to be novel are set forth with particularity in the claims. The invention itself, however, together with further objects and advantages thereof, may be best understood by reference to the following description when taken into conjunction with the accompanying drawings, in which like reference numerals refer to like elements in several figures, and in which:

FIG. 1 is an exploded view of a crystal package constructed in accordance with the present invention;

FIG. 2 is an exploded view of an alternate embodiment of a crystal package constructed in accordance with the present invention;

FIG. 3 is an exploded view of another altenate embodiment of a crystal package constructed in accordance with the present invention;

FIG. 4 is a sectional view along line 4—4 of FIG. 1 illustrating the mounted crystal plate within the crystal package after the package is hermetically sealed; and FIG. 5 is a partial sectional view of an alternative embodiment of the invention, illustrating how the crystal plate may be peripherally supported within the crystal package by the utilization of thermocompression of a nickel-lead beam to the edge of the crystal-plate.

DETAILED DESCRIPTION OF THE PREFERRED EMBODIMENT

Referring now to the drawings, FIG. 1 shows an exploded view of the crystal package assembly 10, illustrating the individual elements thereof, which has been constructed in accordance with the present invention. A ceramic base member assembly 30 consists of a central aperture 32, a plurality of metallized vias, terminal connecting pins and wire bonding pads. A plurality of central recesses 35, 36, and 48 (shown in FIG. 4), and a refactory metallized rim 38 along the entire surface edge of said base member 30. The plurality of metallized vias, terminal connecting pins and wire bonding pads 34 are integral to base member 30 and metallized throughout to assure proper electrical connections to the bottom of the base. The base member 30 is manufactured from a ceramic material which is mounted upon hybrid circuit boards, hybrid modules, or the equivalent. The innermost central recess 35 is keyed at point 37 to receive the associated crystal plate 40. The associated crystal plate 40 has electrode patterns represented at 43, on its top and bottom surfaces and fits within central recess 35 of the base member 30. When the crystal plate 40 is placed within central recess 35, this allows the flat edge of the crystal plate 40 to be placed on a flat surface about the peripheral edge within the central recess 35, thereby supporting the crystal plate 40 during the wire-bonding process which will make the electrical connections. A retaining ring 45 is next placed on the top peripheral edge of the crystal plate 40 in central recess 36. The central recess 36 may have a slight layer of epoxy or similar material placed therein prior to positioning the retaining ring 45 within said central recess 36. This will allow the crystal plate 40 to vibrate freely with no extraneous damped support about the central area. The crystal is then wire bonded, utilizing associated wire bonding pads 44 which are located on the top surface of the crystal plate 40 to the plurality of metallized vias, terminal connecting pins and wire boding pads 34 on the surface of base member 30, thus connecting the appropriate electrode pattern 43 to the outside of the package through the plurality of metallized vias, terminal connecting pins and wire bonding pads 34 (connection not shown). A solder perform 46 is then placed on the metallized rim 38 on the base member 30, and a second solder perform ring 47 is placed in a similar manner around the lower edge of the central aperture 32 of the base member 30. A protective metal cover 50 is placed on the preform 46. Similarly, a bottom protective cover 51 is placed along the bottom edge (not shown) of the central aperture 32. The whole crystal package assembly 10 is thereafter raised to an ambient temperature sufficient to melt the solder preforms 46 and 47 which will then hermetically seal the top cover 50 and the bottom cover 51 to the base member 30. A conductive elastomer pad (if need be) will act as a bridge from the bottom portions of the plurality of metallized vias, terminal connecting pins and wire bonding pads 34 of the base member 30 to the circuitry of the electronic device. Alternately, the package may be reflow soldered. Alternatively, the plurality of metallized vias, terminal connecting pins and wire bonding pads 34 may also be provided to protrude to the base member 30, thereby allowing direct plug-in of the crystal package into the circuitry of an electronic device.

FIG. 2 is an exploded view of the individual elements comprising an alternate embodiment of a crystal package assembly 100 which has been constructed in accordance with the present invention. The base member 60 has raised platform 61 and a flange 62 which extends about the outer perimeter of the base member 60. The base member 60 has a central aperture 63, a plurality of terminal connecting pins 64 integral to the base member 60, and a keyed relationship to the keyed crystal plate 65. The keyed crystal plate 65 has an electrode pattern 66 and a number of wire bonding pads 68 keyed to the terminal connecting pins 64. The crystal plate 65 is placed on top of the inner platform 61 in such a manner as to allow the terminal connecting pins 64 to align themselves with the corresponding bonding pads 68 of the crystal plate 65, thereby enabling the crystal plate 65 to be solely supported at the peripheral edge. A drop of epoxy or similar material at 69 may be used to alignment. Wire bonds are made in a customary fashion between the wire-bond pads 68 on the crystal plate 65 and a like number of terminal connecting pins 64 contained within the base member 60. The wire bonds are of an extremely fine wire and are normally formed in an arc to reduce transmission of vibration to the crystal during operation. A protective metal cover 70 with a flange 71 extending about the perimeter edge is positioned in such a manner over the raised platform 61 of the base member 60, as to align the flange 71 with the extending flange 62 of the base member. Similarly, a second cover 75 will align itself with the bottom portion of the central cavity 63. Thereafter the whole crystal package 100 is hermetically sealed by appropriate sealing methods. The terminal connecting pins 64 which extend through the bottom of the crystal package 100 and may be inserted directly into the circuitry of an associated electronic device.

FIG. 3 is an exploded view of another alternate embodiment of a crystal package 150 which has been constructed in accordance with the present invention. A base member 101 with a central aperture 105 of a predetermined size is surrounded by a recessed area 103. The base member 101 has keyed metallized vias 104 which are in a keyed relationship to the electrode pattern 106 of the crystal plate 102. The crystal plate 102 is placed within the recess area 103 so that the electrode pattern 106 aligns itself with the corresponding metallized pin-out grooves 104 of said base member 101. No wire bonding is required to make the electrical connections from the crystal plate 102 to the base member 101 of the crystal package 150. The crystal plate 102 once placed within the recess area 103 is solely supported about its edge and remains in a free-floating state relative to its central area. The crystal plate 102 may be held in place within the recess area 103 by a small amount of epoxy cement placed on top of the recessed area 103. A reflowable metal top cover 107 and a corresponding bottom cover 108 is then hermetically sealed to the base member 101 utilizing common sealing technologies.

FIG. 4 is a sectional view along line 4—4 of FIG. 1 illustrating the ability of the mounted crystal plate 40 to remain free-floating at its central area after wire bonding of the associated electrode pattern to the terminal connecting pins have occurred and after the crystal package 10 has been hermetically sealed. The hermetic sealing is accomplished by the solder preform 46 beneath the top cover 50 and a similar solder preform 47 beneath the bottom cover 51. The crystal plate is solely supported about its peripheral edge within the recess area 35 and is held firmly in place at a single point by an epoxy cement placed on top of the recess area 35. The retaining ring 45 rests slightly above the peripheral edge of the crystal plate 40. The plurality of terminal connecting pins 34 are integral to the base member 30 and make the elelctrical connections required from the crystal package 10 to the electronic circuitry of the external device.

FIG. 5 is a partial sectional view of an alternate embodiment of the method by which the crystal plate may be damped about its peripheral edge within the crystal package by the utilization of a nickel lead beam 130 which is thermocompression welded to the base member 30 and the crystal plate 40. When this approach is utilized, the retaining ring 45 is not required.

Thus, there has been provided, according to the invention, an improved, simple and inexpensive crystal package which will allow the crystal plate to be adequately supported after initial placement within a retaining support member, allowing wire bonding of the crystal plate electrodes to the terminal pins and hermetically sealing the assembly by a resistance welding process. Although the foregoing has been an description and illustration of specific embodiments of the invention, various modification and changes thereto can be made by persons skilled in the art within the scope and spirit of the invention as defined by the following claims.

What is claimed is:

1. A crystal package for high-G environments comprising: a keyed crystal plate having a first and a second surface, with at least one conductive electrode pattern on a surface thereof;

a base member containing a plurality of keyed terminal connecting pins and a central aperture of a predetermined size smaller than the crystal plate and which will accept the crystal plate so as to support substantally, by gravity alone, the crystal plate throughout its periphery, yet allow the crystal plate to oscillate in an undamped manner when the crystal plate is positioned over the central aperture;

means to electrically connect the plurality of terminal connecting pins to the electrode pattern of crystal plate;

a first protective cover which is of a predetermined size to align itself with the base member;

a second protective cover which is of a predetermined size to align itself with the central aperture; and means for hermetically sealing the protective covers to the base member.

2. A crystal package in accordance with claim 1 wherein the base member is manufactured of a ceramic substrate material.

3. A crystal package in accordance with claim 1 wherein the terminal connecting pins are connected to the electrode pattern of the crystal plate through the utilization of a wire-bonding process.

4. A crystal package for high-G environments comprising:

a keyed crystal plate having a first and a second surface, with at least one conductive electrode pattern on a surface thereof;

a base member, containing a plurality of terminal connecting pins, a first centrally disposed recessed area of a size sufficient to accept the keyed crystal plate, a second centrally disposed recessed area larger than the first, a central aperture which is coaxial with the first recessed area and of a size smaller than the keyed crystal plate, so as to support the crystal, substantially by gravity alone, throughout its periphery, yet permit the crystal plate to freely oscillate in an undamped manner as the crystal plate is positioned within the first recessed area;

a retaining ring, placed in the second recessed area of the base member, and holding the crystal plate in its proper position within the base member;

means to electrically connect the plurality of terminal connecting pins to the electrode pattern of the crystal plate;

a first protective cover of a predetermined size to align and fit the base member;

a second protective cover of a predetermined size to align and fit the central aperture; and means for hermetically sealing the protective covers to the base member.

5. A crystal package in accordance with claim 4 wherein the retaining ring is made of a ceramic substrate material.

6. A crystal package in accordance with claim 4 wherein the base member is manufactured of a ceramic substrate material.

7. A crystal package in accordance with claim 4 wherein the terminal connecting pins are connected to the electrode pattern of the crystal plate through the utilization of a wire-bonding process.

* * * * *